(12) United States Patent
Chen et al.

(10) Patent No.: US 11,486,566 B2
(45) Date of Patent: Nov. 1, 2022

(54) MODULAR POWER SUPPLY SYSTEM

(71) Applicant: Sunlite Science & Technology, Inc., Lawrence, KS (US)

(72) Inventors: Jeff Chen, Lawrence, KS (US); Xiaofang Suo, Lawrence, KS (US)

(73) Assignee: Sunlite Science & Technology, Inc., Lawrence, KS (US)

( * ) Notice: Subject to any disclaimer, the term of this patent is extended or adjusted under 35 U.S.C. 154(b) by 253 days.

(21) Appl. No.: 16/694,758

(22) Filed: Nov. 25, 2019

(65) Prior Publication Data

US 2020/0166200 A1    May 28, 2020

Related U.S. Application Data

(60) Provisional application No. 62/771,300, filed on Nov. 26, 2018.

(51) Int. Cl.
| | |
|---|---|
| *F21V 23/00* | (2015.01) |
| *H01R 13/518* | (2006.01) |
| *H05K 7/20* | (2006.01) |
| *F21V 23/06* | (2006.01) |
| *H05B 45/10* | (2020.01) |
| *H05B 45/37* | (2020.01) |
| *H05K 7/02* | (2006.01) |
| *F21V 29/502* | (2015.01) |
| *F21Y 115/10* | (2016.01) |

(52) U.S. Cl.
CPC ............ *F21V 23/008* (2013.01); *F21V 23/06* (2013.01); *F21V 29/502* (2015.01); *H01R 13/518* (2013.01); *H05B 45/10* (2020.01); *H05B 45/37* (2020.01); *H05K 7/023* (2013.01); *H05K 7/20909* (2013.01); *F21Y 2115/10* (2016.08)

(58) Field of Classification Search
CPC ..... F21V 23/06; F21V 23/008; H01R 13/518; H05K 7/023; H05B 45/37
See application file for complete search history.

(56) References Cited

U.S. PATENT DOCUMENTS

| | | | |
|---|---|---|---|
| 5,652,893 A | 7/1997 | Ben-Meir et al. | |
| 5,897,180 A * | 4/1999 | Singer | F16B 12/26 312/265.3 |
| 6,359,217 B1 * | 3/2002 | Thompson | A47B 21/06 174/50 |
| 7,109,669 B2 | 9/2006 | Bretmersky et al. | |
| 7,585,034 B2 * | 9/2009 | Cabrera | H05K 7/1457 312/350 |
| 8,664,871 B2 | 3/2014 | Yang | |

(Continued)

*Primary Examiner* — Alexander H Taningco
*Assistant Examiner* — Pedro C Fernandez
(74) *Attorney, Agent, or Firm* — Avek IP, LLC

(57) ABSTRACT

Disclosed is a modular housing for drivers used for LED lamps. The housing includes connectors for AC in from a power source, DC out to the lamps, and also has connectors allowing for control lines to be received from a control box. The housing includes an arrangement for creating two opposite stacks of drivers. The fronts of the drivers are cooled by circulating air through the space between the stacks, and heat is also dissipated through the side walls of the housing, which acts as a heat sink. The number and specifications of the drivers in the housing are configured such that every module is able to serve a number of LED lamps.

13 Claims, 6 Drawing Sheets

(56) References Cited

U.S. PATENT DOCUMENTS

| | | | |
|---|---|---|---|
| 8,737,076 B2* | 5/2014 | Wright | H04Q 1/04 |
| | | | 361/724 |
| 8,829,800 B2* | 9/2014 | Harris | H05B 45/375 |
| | | | 315/185 R |
| 9,257,824 B2* | 2/2016 | Laye | H02B 1/32 |
| 9,271,373 B2 | 2/2016 | Fetterly et al. | |
| 9,831,716 B2 | 11/2017 | Mohammed Suhura et al. | |
| 2013/0113394 A1* | 5/2013 | Ido | H05B 45/50 |
| | | | 315/297 |
| 2017/0172015 A1* | 6/2017 | Yu | H05K 7/20909 |

\* cited by examiner

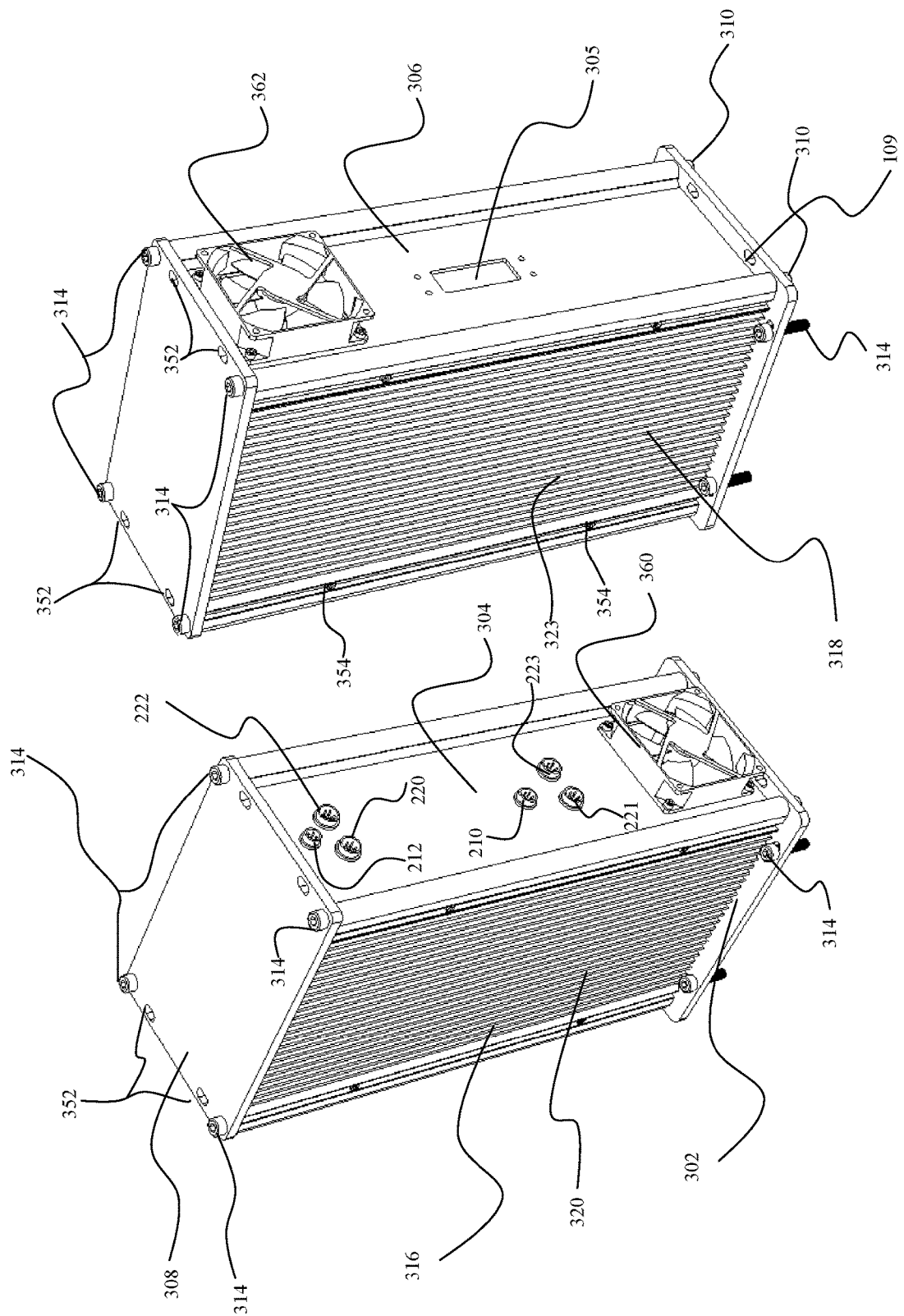

MODULAR POWER SUPPLY SYSTEM

CROSS-REFERENCE TO RELATED APPLICATIONS

This application claims the benefit of U.S. Provisional Application No. 62/771,300 filed Nov. 26, 2018, the contents of which are herein incorporated by reference.

BACKGROUND OF THE INVENTION

1. Field

Generally, the disclosed embodiments relate to the field of supplying power to energy-consumption devices. More specifically, the disclosed embodiments relate to power supply systems for lighting systems, and the related implementation of housings.

2. Description of the Related Art

Power transmission is best done with high-voltage alternating current (AC). LED lamps, however, run on low-voltage direct current (DC). Thus, a system for converting AC to DC is necessary when drawing power from an AC power grid to run LED lamps.

It is known to include all the control circuitry necessary for the AC to DC conversion for serving the LED lamps. Another known process involves building the power supply directly into the main controls wherein the AC source is accessed.

SUMMARY

In embodiments, disclosed is a system having a first modular housing adapted to secure a plurality of drivers, the housing presenting a plurality of exposed external connectors, the connectors configured to receive (i) an AC power line from an AC power source; and (ii) at least one DC outlet connection; the first modular housing facilitating connection between the AC power source and a first DC powered illumination device. Optionally, the first modular housing has a base supporting first and second spaced-apart side walls as well as a first set of internally-facing opposed vertical channels, a first of the opposing channels defined into the first side wall, and a second of the opposing channels defined into the second side wall, the first and second opposing channels together being configured to receive flanges extending outward from each side of the plurality of drivers, the first set of internally-facing opposed vertical channels enabling sliding receipt of at least one driver in the plurality into the housing. In some embodiments, the opposing vertical channels provide for the sliding receipt of and stacking of a first group of drivers.

Optionally, a second set of internally-facing opposed vertical channels can be defined into the first and second side walls and laterally spaced apart from the first of internally-facing opposing channels, the second set of internally-facing opposed vertical channels enabling sliding receipt of a second group of drivers into the housing.

The first modular housing can be one of a plurality of substantially similar modules, the plurality being scalable to meet the needs of a plurality of light units.

In some embodiments, a second modular housing can be configured to be substantially the same as the first modular housing in terms of size and form; a fastener-receiving mechanism is located at the bottom of the first modular housing enabling optional securement to a supporting surface; and a connection arrangement can be located on top of the first housing and bottom of the second housing, the connection arrangement enabling the second module to be securely stackable atop the first module.

Optionally a control-line connector can be formed on an exterior surface of the first modular housing, the control-line connector being configured to receive a control line enabling lighting commands from a control box. Further, the control line connector is configured for receipt of a section control line. Also, the control line connector can be configured for receipt of a dimming control line. Sometimes both exist on the same module.

In specific structural embodiments, the housing can include a base plate, opposing side walls and end walls, and can be adapted to receive first and second stacks of drivers where the stacks define a space. A top plate can be adapted to be secured on top of the side and end walls to enclose the drivers. The space can receive forced air circulation for cooling the drivers.

In embodiments, flanges of each driver of the first and second stacks are received into opposing vertical channels made into the opposing end walls. Further, the opposing side walls can be slid into each of the vertical channels outside of the flanges such that each side wall abuts the backs of each driver in each of the first and second stacks. To help dissipate heat, each of the side walls can be configured to serve as a heat sink relative to the first and second stacks. In some embodiments, external ribbing is used to do this.

In another embodiment, a housing is disclosed for securing drivers within. A ventilation system is used to expose the front surface of the driver to a moving heat medium traveling through the internal space; and the back surface of the driver abuts a heat-transmitting panel of the housing, thus affording heat exchange through the panel into the environment. An exterior surface of the panel can be ribbed or finned to aid in the heat exchange into a surrounding environment.

In other embodiments, modularity is emphasized by providing a modular system. The system delivers power to a plurality of lamps, and includes a plurality of modules. Each module has a number of drivers for converting AC to DC to supply the lamps; at least one AC introduction connector allowing for the attachment of an AC conduit enabling the introduction of AC power to the drivers; at least one DC output connector arrangement, the attachment of at least one conduit enabling the introduction of DC power to the lamps. Further, a total number of the drivers in combination with the specifications of each driver in the number of drivers being such that each module is configured to serve a particular number of lamps.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages will be apparent from the following detailed description of the embodiments and the accompanying drawing figures.

BRIEF DESCRIPTION OF THE SEVERAL VIEWS OF THE DRAWINGS

Illustrative embodiments are described in detail below with reference to the attached drawing figures, which are incorporated by reference herein and wherein:

FIG. 4 shows an assembled housing from a first perspective;

FIG. 5 shows an assembled housing from a second perspective;

Figure 1:
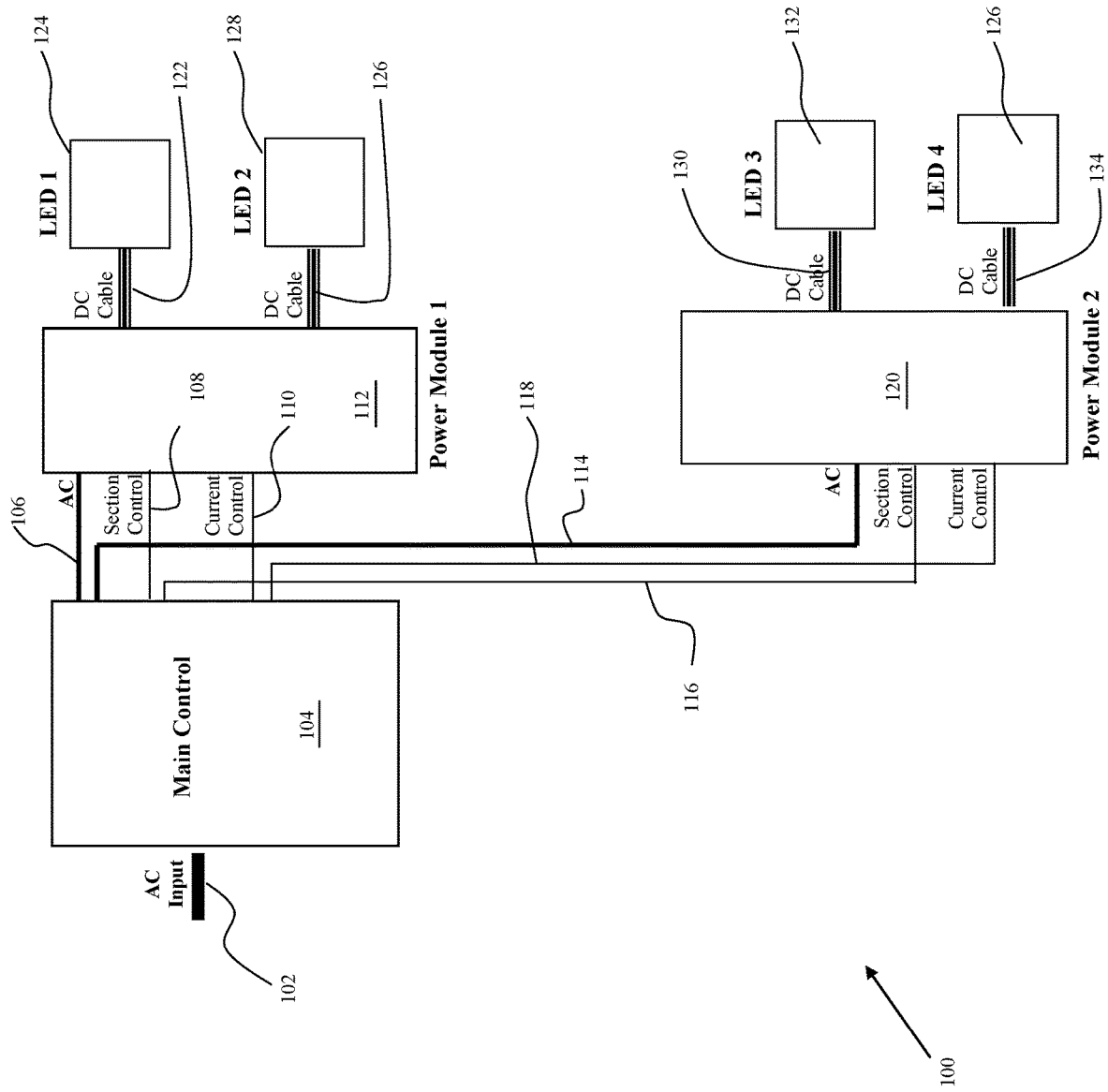
FIG. 1 is a schematic high-level depiction of a power system according to one embodiment.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Embodiments provide systems and a method for powering an energy-consuming device, e.g., LED lamps or really any DC power consuming device. The systems herein very efficiently supply power, and, when utilized in powering high power LED systems, are far more efficient than the conventional systems which must include all the control circuitry necessary physically on the LED lamp fixtures themselves. The conventional systems that build the power supply directly into the control box can create problematic heat-dissipation problems that have to be dealt with. The system herein avoids incorporating power supplies into the control box. The power modules hereinafter discussed are compact, easily assembled, and uniquely provide the heat dissipation that is necessary. The power modules are adapted such that they are easily electronically interposed between the control box and the LED lamps. This is done, in part, using connectors on a module housing for all the necessary electrical cable connections. Additionally, they create a uniform design, enabling them to be implemented according to a ration per-light-source basis. This makes them easy to deploy. The overall result is the effective powering of a high-power LED system.

FIG. 1 shows the modules as they exist in a system embodiment 100 at a high-level. Referring to the figure, it can be seen that the system receives an input 102 from an AC power source, e.g., the power grid. The main control, e.g., power box 104, includes not only the equipment necessary to connect the AC source electrically, but also a system control unit (see FIG. 2). From box 104, a first AC line 106, a section control line 108, and a current control line 110 all extend to a first power module 112. A second AC line 114, and second section and current control lines, 116 and 118 respectively, all extend into a second power module 120.

The first module 112, via a first DC cable 122, serves a first high power LED lamp system 124. A second DC cable 126 serves a second high power LED lamp 128. The second module 120 is shown connecting to a similar lighting arrangement including a DC cable 130 serving a high power LED lamp 132, and a second DC cable 134 serving a high power LED lamp 136.

Figure 2:
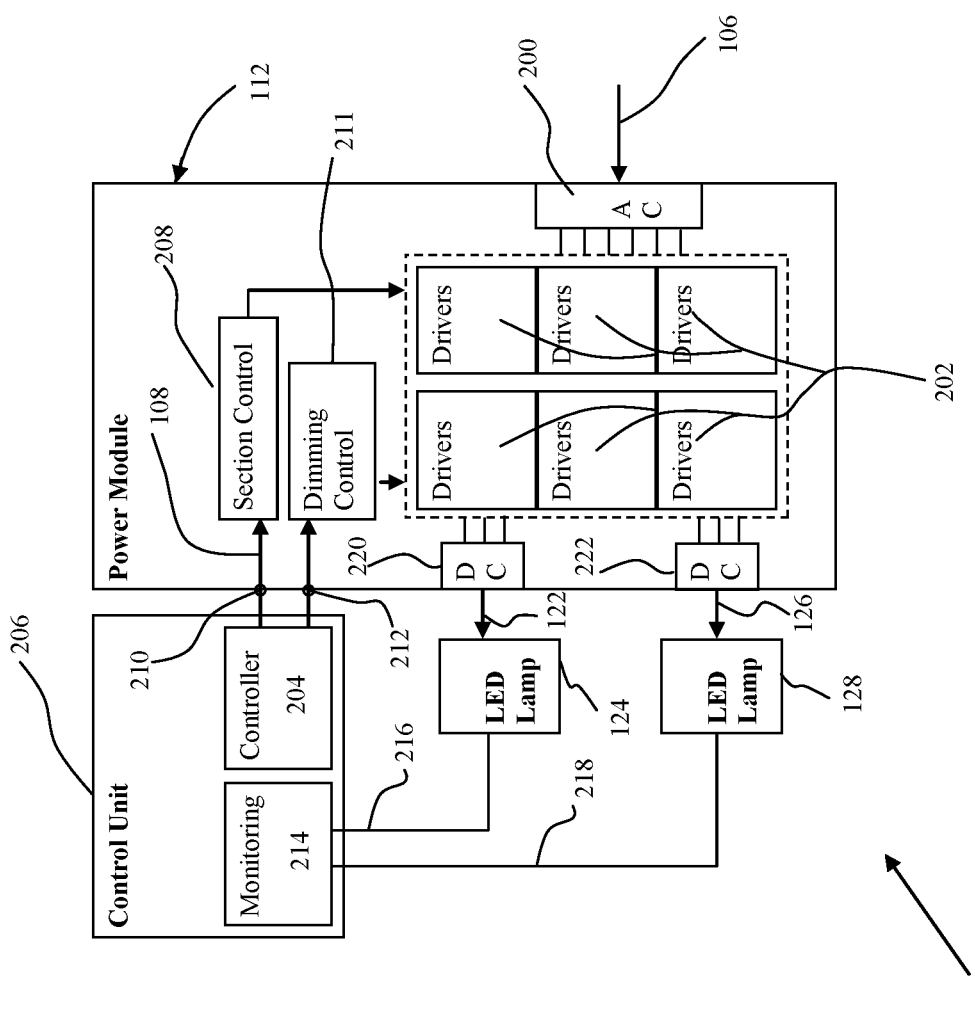
FIG. 2 is a schematic showing an embodiment for a system included in each modular module.

The schematic of FIG. 2 reveals essential internal components in an embodiment 200 for either of modules 112 or 120. Module 112, depicted in FIG. 2 is presented as exemplary, but it should be understood that, in embodiments, module 120 is substantially identical. The module nature of the power units enable these units to be added or subtracted to meet particular needs for any number of lighting requirements. For example, if a design requires increasing the number of lamps in a particular environment, the number of modules can be increased by a same ratio to meet overall demand.

Internally, module 112 in FIG. 2 includes an AC inlet connection 200 for receiving an AC line 106 on the outside of the module 112 from other external source 102. This AC line 106 is used to power a plurality of drivers 202 (see FIG. 2). The use of the term "driver" as used hereinafter is intended to have a broad interpretation. More specifically, the term is intended as including essentially any sort of device that converts AC current into DC, e.g., a wide variety of transformers and other devices. The drivers 202, after processing the current (e.g., converting it from AC to DC) direct the current through a number of pins on the opposite side of the power module to be connected to the LED lamps.

The drivers 202 are wired in such a way that it is possible at any time to deactivate only a particular section of a LED lamp. The number of drivers necessary for each lamp is dependent on the requirements of the LED systems in each lamp. The height of the housing is chosen based on the number of drivers to be used. To manage this, the drivers 202 receive section control orders (e.g., which dictate which lights in the groups of lights are to be active) from a micro controller 204, which is located in a control unit 206 (normally located inside main control box 104). Microcontroller 204 sends commands to a section control unit 208 via line 108, which is connected into a section-control socket 210 on the module housing.

The drivers 202 also receive current control commands from the controller 204 into a dimming control unit 211 through at least one line 110 (or lines) connected into a dimming control socket 212. The dimming control unit 211 then controls the amperage output by the drivers 202 in a known manner.

The embodiment of FIG. 2 also includes a monitoring unit which monitors the temperature of the LED lamp units 124 and 128 via lines 216 and 218, respectively.

The embodiment of FIG. 2 also includes two DC outlet sockets 220 and 222, each socket allowing for the DC electrical connections to be made into separate lamp units, e.g., units 124 and 128, via DC cables 122 and 126 respectively.

Each of modules 112 and 120 can also be included in a housing. An embodiment is shown in FIGS. 3-5, wherein FIG. 3 is an exploded view of the module exposing the drivers, FIG. 4 shows an assembled housing from a first perspective; and FIG. 5 shows the same assembled housing from a second perspective.

Figure 3:
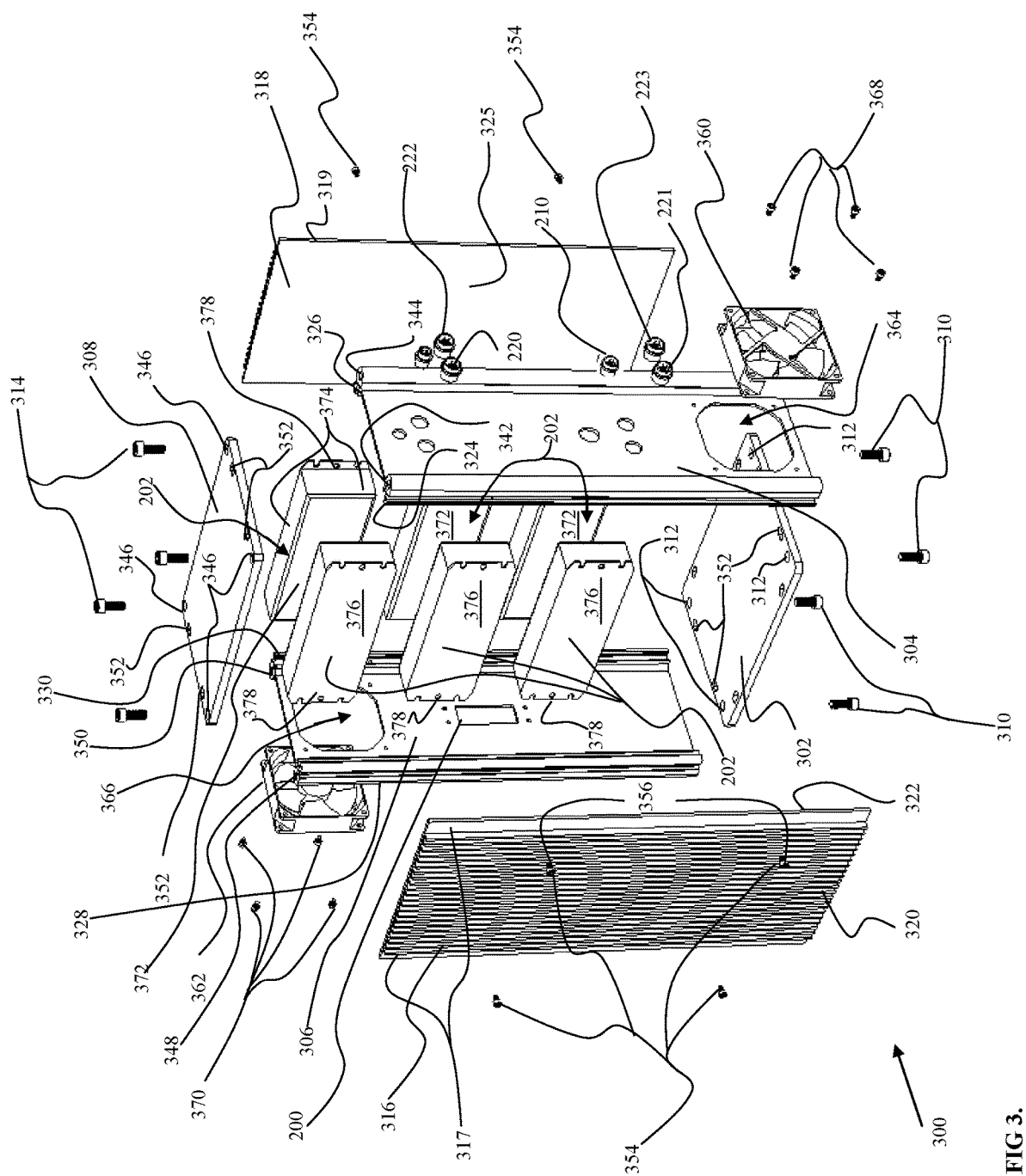
FIG. 3 is an exploded view showing a power-module housing for an embodiment.

Referring first to FIG. 3, it can be seen that a housing 300 includes numerous components including a base plate 302 which will fastened to and support a first side wall (left end wall 304) and a second opposite side wall (right end wall 306). Left and right end walls, 304 and 306 respectively, will be fastened underneath, and thus support a top plate 308. A fastener set (e.g., four bolts) 310 will be received through a plurality of reciprocating apertures (e.g., four slots) 312 made through base plate 302, then secured into threaded apertures (not shown in FIG. 3) to secure the walls 304 and 306 to the base 302. Similarly, a fastener set 314 (e.g., four bolts) will be received through four reciprocating slots 316 into threaded apertures (not shown in FIG. 3) at the top of the walls 304 and 306 to secure the top plate 308.

The housing shell is completed using a front plate 316 and a back plate 318. In the preferred embodiment, front plate 316 has a ribbed or finned heat-dissipating exterior surface 320, and a smooth inside surface 322. Similarly, back plate 318 also has a ribbed (or finned) heat-dissipating exterior 323 and a smooth interior 325.

FIG. 3 also reveals the connectors referenced in FIG. 2. More specifically, the connectors 210 and 212 for the section and dimmer/current control lines respectively are shown. An aperture 305 used to receive the AC connector in a known manner (not shown since is preinstallation) is also shown. Finally, two optional DC connectors 221 and 223 are also shown. Optional connectors 221 and 223 will be employed based on need for use depending on lamp/driver specifics.

Figure 6A:
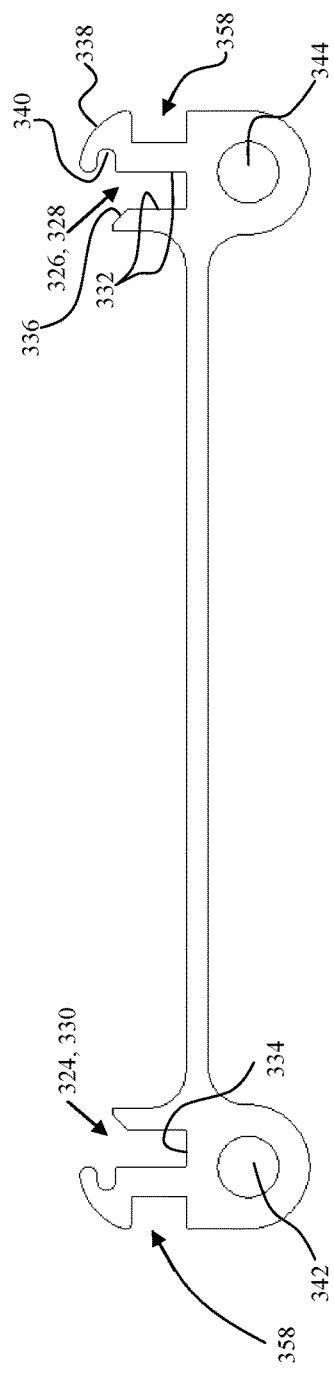
FIG. 6A shows a top view of each wall (right or left)

Each of plates 316 and 318 are each made to be slidably received into vertically-opposite channels formed into the inside of lateral edges of each of walls 304 and 306. The channels are consistent in configuration from top to bottom. The top view (also substantially accurate as a cross sectional view at any vertical position) is shown in FIG. 6A. Wall 304 includes two channels 324 and 326, which are opposite and lined up with reciprocating channels 328 and 330 which have been configured into wall 306. In the FIG. 6A view, it can be seen that the channels 328 and 324 formed into each of walls 304 and 306 have substantially parallel planar sides 332 and an abutment floor 334. The profile also includes an inwardly ramped portion 336 on the innermost portion of the mouth of the channel, and on the other side of the mouth, there is an enlarged cap 338 having a recessed out portion 340. The ramped portion 336 will aid in directing the plate ends into the channels, whereas the cap 338 creates a flexibility that is likewise beneficial upon insertion. FIG. 6A also reveals two fastener receiving bores 342 and 344, which can be threaded or not, and are used to secure a top plate (e.g., top plate 308) through a plurality of apertures 346 defined there through. FIGS. 4 and 5 show a plurality of fasteners (e.g., four bolts 314) which could be received into reciprocating threaded apertures (e.g., bores 342, 344, 348, and 350 atop both walls 304 and 306) to attach the top plate 308.

Slots 352, as shown in FIGS. 4-5, are defined into each top plate 308 and bottom plate 302. The slots enable placing and securing one power box on the top of the other or another modular unit (not shown) which can be stacked atop the lower unit (e.g., housing unit 300). FIGS. 4 and 5 show a plurality of fasteners (e.g., four bolts 346) which could be an additional modular housing unit on top of a substantially identical unit below it, or other securing means in a bracket (not shown), or alternatively, could be driven (e.g., bolts, screws) into some already existing structure in an installation area.

Once the front and back plates 316 and 318 are slid down into place, screws 354 are passed though apertures 356 made into the lateral margins of each of the plates to secure the plates. The screws 354 are ultimately driven into recessed areas 358 (see FIG. 6A) which enable driving the screws through the thinned out walls created to secure the margins 317 and 319 of plates 316 and 318.

An internal active heat-exchanging arrangement is also shown. The arrangement uses air as the medium. More specifically, in the disclosed embodiment, the air is driven through the inside of the housing using at least one fan. Referring to FIGS. 4 and 5, it can be seen that a first fan 360 and a second fan 362 are attached over fan-receiving apertures 364 and 366 using fastener sets 368 and 370 (e.g., screws), respectively. The fans 360 and 362 are oriented to conduct cooling air through the inside of the housing in a common direction. This is done by orienting one of the fans to blow air into the housing, and the other fan to exhaust air out of the housing. For example, if fan 360 is adapted to intake air, fan 362 is oriented to exhaust air, and vice versa. The air circulation happens, in large part, through the space created between two opposing stacked columns of installed drivers 202. Alternatively, one of the two fans 360 and 362 depicted could be replaced with a filter. In this scenario, the fan would exhaust, and air would be drawn into the housing through the filter (not shown). Regardless of the air-handling arrangement, the air enables active heat exchange between the top surface 372 and side surfaces 374 of each driver 202.

A passive heat exchange arrangement releases heat through the front and back plates 316 and 318. The drivers are individually encased in aluminum, which acts as a heat sink, and here, a connection is made to the larger aluminum housing structure for efficient cooling. To do this, heat generated by the drivers 202 is dissipated from a back side 376 of each device and then travels outward through each of front plate 316 and back plate 318. More specifically, the driver backs 376 abut the smooth side of each plate (side 322 for front plate 316, and side 325 for back plate 318). Thus, the heat travels into these smooth sides, and then is dissipated outside the housing. The dissipation is aided by the finned/ridged sides 320 and 323.

Universal Tops and Bottoms, Sizable Walls

Although only one size is shown in the figures, it should be understood that the power modules are made with a metallic housing which includes top and bottom plates that are of a universal design. The front, back, left and right plates come in varying heights designed to include different quantities of drivers. Thus, the design is easily scalable in terms of the height of the housing can be increased to increase the potential power supplied, and to serve different lamps. The tops 308 and bases 302 of the housings are universal, whereas the heights of the sides, front, and back can be raised or lowered to change the number of drivers.

Modularity

The modular nature also makes the units able to service a different numbers of lamps without increasing driver installations to accommodate. For example, in conventional systems the drivers are simply fastened into the control box, e.g., main control 104. Due to the modular power supplies like modules 112 and 120 (see FIG. 1), were there to be eight lamps in the particular area instead of just the four (lamps 124, 128, 132, and 136), you could simply add two more modules arranged in the same way to accommodate.

Assembly Process

A process of assembly is also disclosed. A first step involves using the bottom plate as a base. First, the bolts 310 are brought up through apertures 312 and then into corresponding threaded bores (not shown) created into the bottoms of each of the left and right plates 304 and 306. Once these bolts 310 are tightened, the plates are firmly supported and secured atop the bottom plate 302.

A second step involves installing the electrical equipment and connectors, including: installing an AC connector 200 into the accordingly configured aperture 305 existing in wall 306; installing the section control connector 210, dimming/current control connector 212, and the DC electrical connectors 220 and 222 into the corresponding apertures formed into wall 304; mounting a section control board onto one of the walls, or locating it elsewhere in the housing. These installations to the left and right plates 304 and 306 make it so that the tower may receive and distribute power and control.

A third step involves adding the active heat exchange equipment. More specifically, each of fans 360 and 362 are mounted using fastener sets 368 and 370 as shown. The fans 360 and 362 are installed such that one is oriented to direct air in, and the other directs air out. Alternatively, an air filter (not shown) can be substituted for the intake fan.

Figure 7:
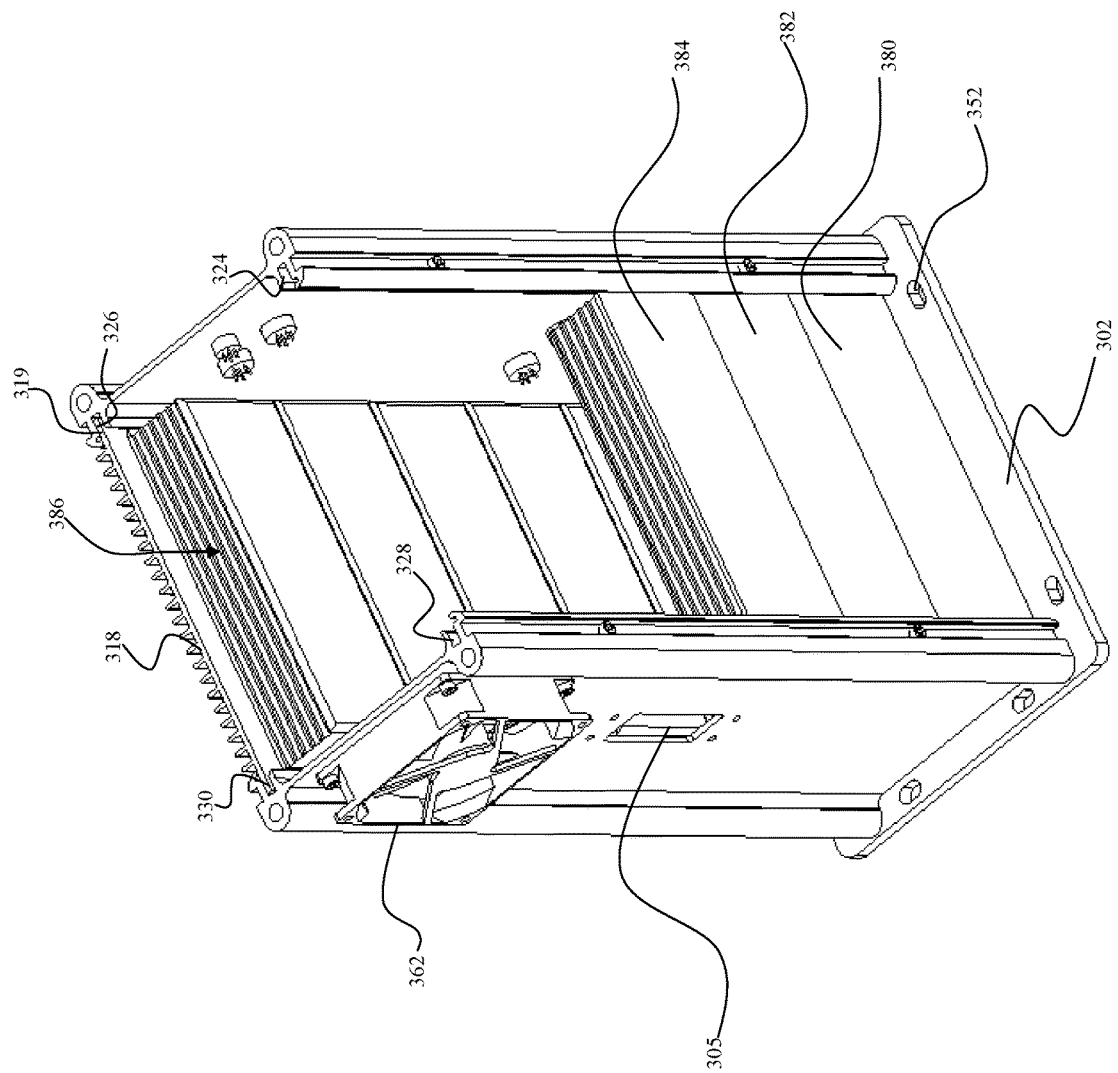
FIG. 7 shows a perspective view from the top of the module with the top plate removed.

In a fourth step, the drivers 202 are installed into the housing. As can be seen in FIG. 3, each of the drivers 202 has outwardly-extending flanges 378 on both ends. These flanges, also referred to as "ears", exist conventionally so that fasteners can be received into the flanges to secure the driver to some object, e.g., into the master control box. Here, however, these flanges 378 are slid down into each opposing channels, e.g., channels 324 and 326, which are opposite and lined up with reciprocating channels 328 and 330, from the top. Each driver in the plurality 202, upon being inserted, is stacked. For example, the flanges of a first bottom driver 380 can be inserted into the opposing channels (e.g., channels 328 and 330) and then slid downward until it rests on the floor of the housing. Next, the flanges of a second driver 382 can be inserted into the same channels 328 and 330, and then slid down to rest on top of the first driver 380. See, e.g., FIG. 7. Then, the flanges of a third driver 384 are inserted into the same channels and slid down rest on top of the second driver is inserted into and stacked on top of the second driver 382.

Now that the first side of drivers has been installed (including drivers 380, 382, and 384, the second stack 386 is then created on the other side of the housing. Second stack 386 is created in the same manner by inserting the flanges into the channels and stacking the drivers. A top view of the stacked columns can be seen in FIG. 7. A space 388 exists in the housing between the two stacked columns of drivers.

Once the drivers are stacked, the driver input wires are connected to the AC connector 200, the control lines are connected to the proper control line connectors, and the driver output wires are connected to one of the two DC output connectors. The wiring, after full installation, will exist between the inside faces of the drivers (see FIG. 7).

Figure 6B:
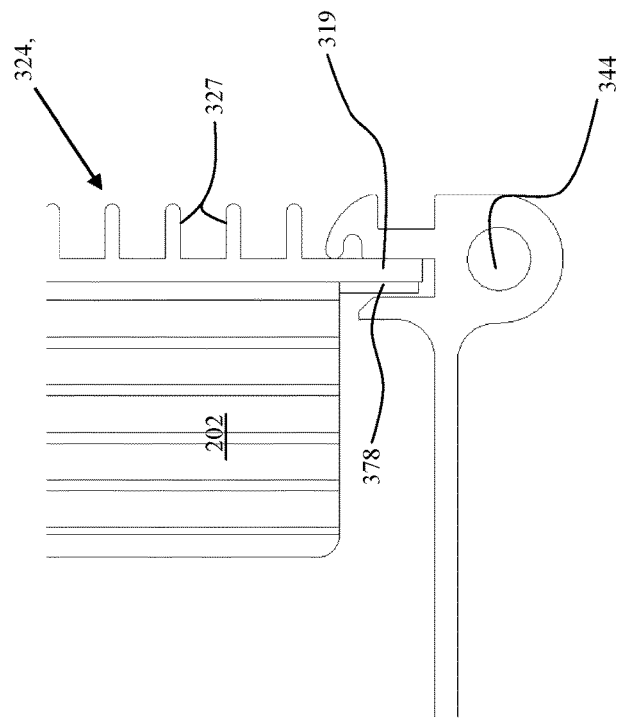
FIG. 6B shows a top view broken out of the right hand corner of the wall shown in FIG. 6A with flanges of a driver as well as a plate margin inserted.

Next, the front and back plates are installed. Extra space is created in the channels beyond what is necessary to accommodate the driver flanges. The margins 317 and 319 of the front and back plates 316 and 318, respectively, are received into this space, and then slid down with the finned side out. The assembled arrangement is shown on the top side of FIG. 7, where the back plate 318 has been slid down. But in front, the front plate 316 has yet to be installed. FIG. 6B shows the detail at the top right corner taken from FIG. 6A, but after the driver flange 378 and back plate margin 319 have been installed. The figure depicts how the plate margins are received into a space in the channel existing outside of the inserted driver flanges (after stacking).

Next, the wires are connected into the section control board, and wires are extended and connected to the fans (or to the single fan depending on the arrangement). Once the wiring has been completed, in a final step bolts (e.g., bolts 314 in FIG. 3) are received into threaded bores 342, 344, 348, and 350 atop both walls 304 and 306 to attach the top plate 308.

When the housing 300 shown in FIGS. 3-5 is assembled as discussed above to house the drivers 202 and other circuitry, they form an upright cuboid/rectangular prism with several features. The top and bottom panels have holes for bolts (e.g., slots 352) near the edges so that multiple housings can be bolted together vertically, and the bottom housing can be secured to a floor or other surface. Thus, the modules, when embodied in a housing like the one shown in FIGS. 3-5, are stackable upward from the surface on which they are mounted.

The air circulated in and out of the housing using the fans helps cool internally, whereas the cooling fins on the front and back panels enable the outside faces of the drivers to rapidly dissipate heat. The connectors offered on the side walls 304 and 306 allow for easy electrical connectivity for input and output cables. The entire design works to safely store the high-current electrical equipment while rejecting as much heat as possible.

Many different arrangements of the various components depicted, as well as components not shown, are possible without departing from the spirit and scope of what is claimed herein. Embodiments have been described with the intent to be illustrative rather than restrictive. Alternative embodiments will become apparent to those skilled in the art that do not depart from what is disclosed. A skilled artisan may develop alternative means of implementing the aforementioned improvements without departing from what is claimed.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A system comprising:
   a first modular housing a base supporting opposing first and second side walls, and opposing first and second end walls;
   a first set of internally-facing opposing vertical channels defined between the first and second side walls and configured to receive the outwardly-extending flanges of one or more drivers thus enabling the one or more drivers to be slid down into the housing such that the one or more drivers abut an internal surface of the first end wall, the first end wall being configured to act as a passive heat exchanger; and
   the housing presenting a plurality of exposed external connectors, the connectors configured to receive (i) an AC power line from an external AC power source to the one or more drivers; and (ii) at least one DC outlet connection enabling connection between the one or more drivers and a first DC powered illumination device.

2. The system of claim 1 wherein the first set of internally-facing opposing vertical channels provide for the sliding receipt of and stacking of a first group of drivers along an inside wall of the first end wall.

3. The system of claim 2 comprising:
a second set of internally-facing opposed vertical channels defined between the first and second side walls, the second set of internally-facing opposed vertical channels enabling sliding receipt of a second group of drivers into the housing along an inside wall of the second end wall.

4. The system of claim 3 wherein an air-circulation system forces air to circulate through a space existing between the internally-facing surfaces of the first group of drivers and the internally facing surfaces of the second group of drivers to cool the first and second groups of drivers in addition to passive heat dissipation out of the first and second groups of drivers conducted through the first and second end walls.

5. The system of claim 1 wherein the first modular housing is one of a plurality of substantially similar modules, the plurality being scalable to meet the needs of a plurality of light units.

6. The system of claim 1 comprising:
a second modular housing configured to be substantially the same as the first modular housing in terms of size and form;
a fastener-receiving mechanism at the bottom of the first modular housing enabling optional securement to a supporting surface;
a connection arrangement located on top of the first housing and bottom of the second housing, the connection arrangement enabling the second module to be securely stackable atop the first module.

7. The system of claim 1 comprising:
a control-line connector formed on an exterior surface of the first modular housing, the control-line connector being configured to receive a control line enabling lighting commands from a control box.

8. The system of claim 7 wherein the control line connector is configured for receipt of a section control line.

9. The system of claim 7 wherein the control line connector is configured for receipt of a dimming control line.

10. The system of claim 1 wherein the first modular housing further comprises:
a top plate adapted to be secured on top of the first and second side walls and first and second end walls to enclose the first group of drivers.

11. The system of claim 10 wherein the base plate and the top plate for a plurality of modules are consistently equally sized, but the side and end walls for different groups of modules are cut to different sizes to accommodate different lamp arrangements.

12. The system of claim 1 wherein the first and second side walls are installable by being slid into each of the first and second sets of internally-facing opposing vertical channels outside of the flanges of each of the first and second groups of drivers such that each of the first and second side walls abut the backs of each driver in each of the first and second groups.

13. The system of claim 12 wherein the first side wall has an exterior surface which is ribbed or finned to enhance heat conduction from the first group of drivers.

* * * * *